(12) United States Patent
Barraud et al.

(10) Patent No.: US 10,217,849 B2
(45) Date of Patent: Feb. 26, 2019

(54) METHOD FOR MAKING A SEMICONDUCTOR DEVICE WITH NANOWIRE AND ALIGNED EXTERNAL AND INTERNAL SPACERS

(71) Applicant: COMMISSARIAT A L'ENERGIE ATOMIQUE ET AUX ENERGIES ALTERNATIVES, Paris (FR)

(72) Inventors: Sylvain Barraud, Le Grand Lemps (FR); Emmanuel Augendre, Montbonnot (FR); Remi Coquand, Les Marches (FR); Shay Reboh, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/837,298

(22) Filed: Dec. 11, 2017

(65) Prior Publication Data

US 2018/0175163 A1 Jun. 21, 2018

(30) Foreign Application Priority Data

Dec. 15, 2016 (FR) ..................... 16 62530

(51) Int. Cl.
*H01L 21/00* (2006.01)
*H01L 29/66* (2006.01)
(Continued)

(52) U.S. Cl.
CPC ...... *H01L 29/6681* (2013.01); *H01L 29/0673* (2013.01); *H01L 29/42392* (2013.01);
(Continued)

(58) Field of Classification Search
CPC ............ H01L 29/6681; H01L 29/6653; H01L 29/6656; H01L 29/0673; H01L 29/66545; H01L 29/42392
See application file for complete search history.

(56) References Cited

U.S. PATENT DOCUMENTS 7,354,831 B2 * 4/2008 Orlowski ............... B82Y 10/00
257/347
8,679,902 B1 3/2014 Basker et al.
(Continued)

FOREIGN PATENT DOCUMENTS

EP 2 654 083 A1 10/2013
EP 2 750 170 A1 7/2014
WO WO 2015/050546 A1 4/2015

OTHER PUBLICATIONS

French Preliminary Search Report dated Aug. 4, 2017 in French Application 16 62530 filed on Dec. 15,2016 (with English Translation of Categories of Cited Documents).

*Primary Examiner* — Richard A Booth
(74) *Attorney, Agent, or Firm* — Oblon, McClelland, Maier & Neustadt, L.L.P.

(57) ABSTRACT

Method for making a semiconductor device, comprising:
a) making of a stack of crystalline semiconductor layers comprising a first layer and a second layer capable of being selectively etched in relation to the first layer,
b) etching of part of the stack, a portion of the first layer forms a nanowire (132) arranged on the second layer,
c) selective etching of second layer,
d) making, beneath the nanowire, of a sacrificial portion which has an etching selectivity which is greater than that of the second layer,
e) making of a sacrificial gate and of an external spacer surrounding the sacrificial gate,
(Continued)

f) etching of the stack, revealing ends of the nanowire and of the sacrificial portion aligned with the external spacer, g) selective etching of parts of the sacrificial portion, from its ends, forming aligned cavities beneath the external spacer, h) making of an internal spacer within the cavities.

14 Claims, 12 Drawing Sheets

(51) Int. Cl.
  *H01L 29/06*   (2006.01)
  *H01L 29/423*   (2006.01)
  *H01L 29/78*   (2006.01)
  *H01L 29/786*   (2006.01)

(52) U.S. Cl.
  CPC ...... *H01L 29/6653* (2013.01); *H01L 29/6656* (2013.01); *H01L 29/66545* (2013.01); *H01L 29/66553* (2013.01); *H01L 29/7853* (2013.01); *H01L 29/78696* (2013.01)

(56) References Cited

U.S. PATENT DOCUMENTS

| | | | |
|---|---|---|---|
| 8,686,428 B1 * | 4/2014 | Sekar | ............... H01L 21/8221 |
| | | | 257/173 |
| 8,969,148 B2 | 3/2015 | Vinet et al. | |
| 9,583,339 B2 | 2/2017 | Posseme et al. | |
| 2008/0135949 A1 | 6/2008 | Lo et al. | |
| 2013/0153993 A1 | 6/2013 | Chang et al. | |
| 2013/0302955 A1 | 11/2013 | Vinet et al. | |
| 2014/0187046 A1 | 7/2014 | Posseme et al. | |
| 2014/0312432 A1 | 10/2014 | Ching et al. | |
| 2015/0372115 A1 | 12/2015 | Koh et al. | |
| 2016/0300709 A1 | 10/2016 | Posseme et al. | |
| 2016/0315167 A1 | 10/2016 | Nakamura et al. | |

* cited by examiner

METHOD FOR MAKING A SEMICONDUCTOR DEVICE WITH NANOWIRE AND ALIGNED EXTERNAL AND INTERNAL SPACERS

TECHNICAL FIELD AND PRIOR ART

This document concerns a method for making a semiconductor device with semiconductor nanowire or nanowires and comprising an internal spacer which is aligned relative to an external spacer. This document applies in particular to the making of transistors with multiple gates, or multi-gate transistors, for example of the GAAFET (Gate-All-Around Field-Effect Transistor") type. This document applies in particular to the field of FET devices used for high-performance, low energy-consumption logic applications in microelectronics, as well as that of the design and manufacture of FET transistors which each comprise several nanowires superimposed upon each other, used in the design of integrated circuits which have improved electrical performance levels in comparison with the state of the art.

This document advantageously applies to the making of one or more GAAFET transistors which are co-integrated, on the same substrate, with one or more FinFET ("Fin Field Effect Transistor") transistors.

Document US 2008/0135949 A1 describes a method for making an FET transistor whose channel is formed of several superimposed nanowires. In this method a stack of layers semiconductor layers comprising alternating layers of silicon and layers of SiGe is first of all made. When silicon is the material to be used to form the nanowires, selective removal of the SiGe relative to the silicon is carried out at the transistor channel region so as to release the silicon nanowires before deposition of the transistor gate around these nanowires.

With such a method, constricting design rules must be applied in order to be able to release the silicon nanowires whilst maintaining the structure. As a result of these design rules, the overall dimensions of the semiconductor blocks forming the source and the drain are large and do not allow a high nanowire density to be achieved. Furthermore, satisfactory positioning as well as satisfactory definition of the gate pattern prove to be difficult to achieve.

Documents U.S. Pat. No. 8,679,902 B1 and EP 2 654 083 A1 describe other methods for making transistors whose channels comprise superimposed nanowires and which are equipped with a gate-all-around arrangement around the nanowires. In these documents, the gate is formed by a damascene-type method (an approach known as "Gate-Last" or "Replacement Metal Gate" (RMG)), wherein:

- a sacrificial gate is first of all formed by covering a stack of alternating layers of silicon and of SiGe in the channel region, then
- gate spacers and the source and drain regions are made, then
- the sacrificial gate is then etched through a layer of mask covering the entire structure, where this mask also serves to remove the SiGe (when SiGe is used as a sacrificial material and when it is intended to form the channel from silicon nanowires) at the transistor channel region in order to form nanowires, and finally
- the definitive gate is made in the space formed by the etching of the sacrificial gate.

The drawback of such an approach is that the etching used to remove the SiGe at the channel region does not stop at the level of the opening formed in the mask layer for removal of the sacrificial gate, with this etching spreading towards the source and drain regions. During the selective removal of the SiGe relative to the silicon, there is no auto-alignment of the SiGe removed with the location defined for forming the gate. Consequently, the definitive gate deposited after the removal of these sacrificial layers is not auto-aligned with the volume formed only by the removal of the sacrificial gate. This results in an increase in interference capacitances within the transistor, since during the filling of the cavity with gate material some zones at the edge of the gate cover the source and drain zones.

DESCRIPTION OF THE INVENTION

Thus there is a need to propose a method for making a semiconductor device with semiconductor nanowire or nanowires which allows correct alignment of the internal spacer in relation to, or regarding, the external spacer to be achieved, which is suitable for making transistors with a high density on the support and which does not possess the above-mentioned drawbacks of the methods of the prior art.

In order to achieve this, one embodiment proposes a method for making at least one semiconductor device which comprises at least:

a) making, on a support, of a stack of layers comprising at least one first crystalline semiconductor layer and at least one second crystalline semiconductor layer capable of being selectively etched in relation to, or regarding, the semiconductor of the first layer, wherein the second layer is arranged between the first layer and the support;

b) etching of part of the stack of layers such that at least one portion of the first layer forms a nanowire arranged on a portion of the second layer;

c) selective etching of said portion of the second layer;

d) making, in at least one space formed beneath, or under, the nanowire by etching of said portion of the second layer, of at least one portion of sacrificial material, where the selectivity of etching of the sacrificial material relative to the semiconductor of the first layer is greater than that of the semiconductor of the second layer relative to, or regarding, the semiconductor of the first layer;

e) making of at least one sacrificial gate and of at least one external spacer laterally surrounding the sacrificial gate;

f) etching of the stack of layers, revealing ends of the nanowire and of the portion of sacrificial material that are aligned with the external lateral faces of the external spacer;

g) selective etching of parts of the portion of sacrificial material, from the ends of the portion of sacrificial material, forming aligned cavities beneath, or under, the external spacer;

h) making of at least one internal spacer in the cavities, aligned with the external spacer.

Unlike the methods in the prior art wherein the internal spacer is formed in cavities obtained by directly etching the initial stack of crystalline semiconductor layers, this method proposes releasing the nanowire beforehand then subsequently depositing, at least beneath this nanowire, a sacrificial material which exhibits greater etching selectivity relative to the nanowire semiconductor. Thus, unlike a method wherein the locations of the internal spacer are defined by etching the SiGe selectively in relation to the silicon (or conversely), the etching carried out to form the locations of the internal spacer is much better controlled thanks to the use of the sacrificial material arranged beforehand against or around the nanowire, thus improving the control over the thickness of material consumed by this etching. This allows an internal spacer to be made which is correctly aligned with the external spacer present above the nanowire, thus preventing the deposition of gate materials in regions, for example, intended for making of sources and drains.

Moreover this method is well suited to the making, on the same substrate, of several transistors with a high density ("pitch" of 40 nm or less, for example between about 30 and 40 nm).

Advantageously, the sacrificial material may be a semiconductor oxide, for example $SiO_2$.

The external spacer may advantageously comprise a dielectric material with a dielectric permittivity of less than or equal to 7. This reduces interference capacitances and therefore increases the operating speed of a CMOS circuit comprising transistors made by implementing this method.

The layers of the stack may be made by epitaxy from a layer of semiconductor of the support.

The semiconductor of the first layer may be silicon or SiGe and the semiconductor of the second layer may be SiGe comprising a proportion of Germanium greater than that of the semiconductor of the first layer. Alternatively, the semiconductor of the second layer may be silicon or SiGe and the semiconductor of the first layer may be SiGe comprising a proportion of Germanium greater than that of the semiconductor of the second layer.

The semiconductor device may comprise at least one GAAFET type transistor whose channel is formed at least in part by the nanowire. This method advantageously applies to the making of GAAFET transistors which advantageously have gate lengths less than about 20 nm.

In this case the method may moreover comprise, between steps d) and e), a step for making isolation trenches around the nanowire and the portion of sacrificial material. The isolation trenches may be of the STI (Shallow Trench Isolation) type. These trenches may in particular be made through a part of the thickness of the support. The nanowire is thus made before the isolation trenches (and not afterwards, as is usually the case), which preserves any stress present in the nanowire and facilitates the achievement of a high nanowire density.

The method may moreover comprise, between steps a) and b), the making on the support of at least one portion of semiconductor with a thickness substantially equal to that of the stack of layers, and the making of isolation trenches may comprise performing etching which also forms fins capable of forming the channel of a FinFET type transistor in said portion of semiconductor. The portion of semiconductor with a thickness substantially equal to that of the stack of layers can form, in this case, with the support, a bulk type substrate from which one or more FinFET transistors can be made.

Thus co-integration of one or more GAAFET transistors with one or more FinFET transistors is achieved. At least a part of the steps performed to make the GAAFET transistor or transistors may also be used to make the FinFET transistor or transistors.

The stack of layers may comprise several first layers stacked in an alternating manner with several second layers, and steps b) to h) may be performed for all of the first and second layers. Thus the etching step b) may form several superimposed nanowires separated from one another by portions of the second layers.

Etching step b) may make several portions of the first layer forming several nanowires arranged next to each other, and steps c) to h) may be performed for all of said nanowires.

The support may correspond to a bulk semiconductor substrate upon which the stack of layers is made. Alternatively, the support may comprise a thick layer and a buried dielectric layer of a semiconductor on insulator type substrate, such that a surface layer of the substrate semiconductor forms the second layer of the stack made on the support.

Step d) may comprise performing deposition of sacrificial material around the nanowire. Thus the method may subsequently comprise, after the making of an internal spacer, the making of an all-around gate or a gate arranged at least partially around the nanowire.

Etching step b) may be performed from a hard mask made on the stack using a SIT (Sidewall Image Transfer) type method, or DSA (Direct Self-Assembly) method, or EUV (Extreme Ultra-Violet) lithography.

The method may moreover comprise, after step h), performing the following steps:
making of source and drain regions in contact with the ends of the nanowire;
removal of the sacrificial gate and of the portion of sacrificial material;
making of a gate at locations formed by the removal of the sacrificial gate and of the portion of sacrificial material, such that the gate at least partially surrounds the nanowire and such that the internal and external spacers laterally surround the gate.

In this case the source and drain regions can be made by the use of semiconductor epitaxy from a semiconductor of the support.

The sacrificial gate and the gate may each comprise several distinct portions separated from each other.

This method is advantageously performed for the manufacture of FET-type transistors used for making integrated circuits for high-performance and low electrical consumption logic applications, for NAND type Flash memories, molecular memories or for other applications of the charge sensor type. More generally this method may be applied to the making of any structure which requires alignment of the gate between two or more superimposed semiconductor nanowires which are separated from each other.

This method may be applied to the making of any type of semiconductor device requiring a good alignment of the gate in relation to one or more nanowires suspended above a support, or alignment of an internal spacer with an external spacer.

The term "nanowire" is used here to designate any portion of material of nanometric dimensions and of elongated form, irrespective of the form of the cross-section of this portion. Thus this term designates both elongated portions of material of circular or substantially circular cross-section and portions of material in the form of nano-beams or nano-bars which comprise, for example, a cross-section that is rectangular or substantially rectangular.

BRIEF DESCRIPTION OF THE DRAWINGS

The present invention will be better understood on reading the description of example embodiments, given purely as an indication and in no sense restrictively, making reference to the appended illustrations in which.

Identical, similar or equivalent parts of the various figures described hereafter have the same numerical references, to make it easier to move from one figure to another.

In order to make the figures more readable, the various parts shown in the figures are not necessarily shown at a uniform scale.

The various possibilities (alternative variants and embodiments) must be understood as not being mutually exclusive, and being capable of being combined with one another.

DETAILED DESCRIPTION OF SPECIFIC EMBODIMENTS

Figure 1A:
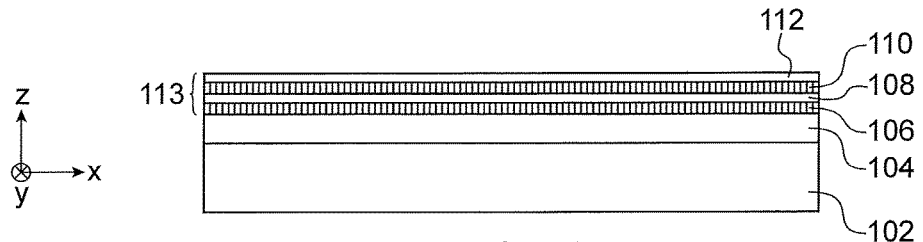
FIGS. 1A to 1Z show the steps of a method for making semiconductor nanowire transistors according to a particular embodiment.
Figure 1B:
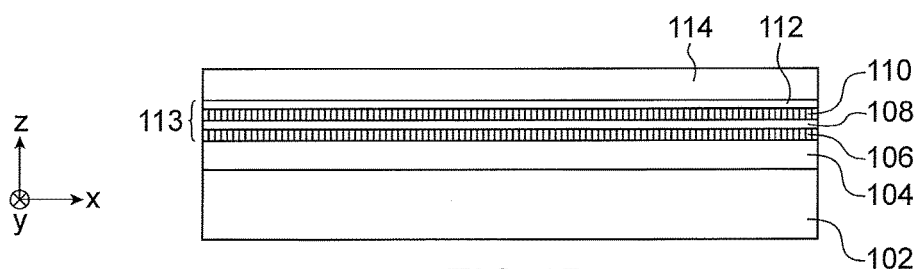
Figure 1C:
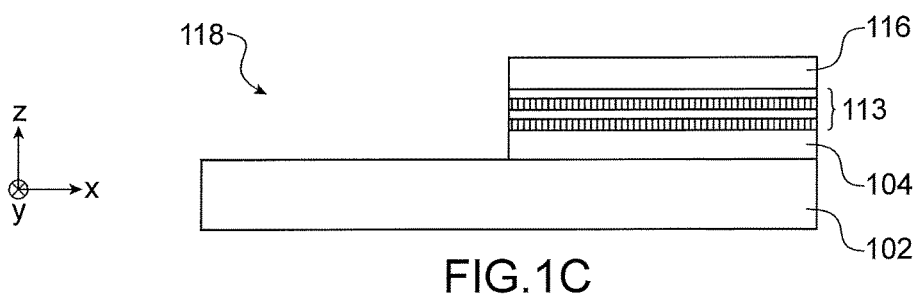
Figure 1D:
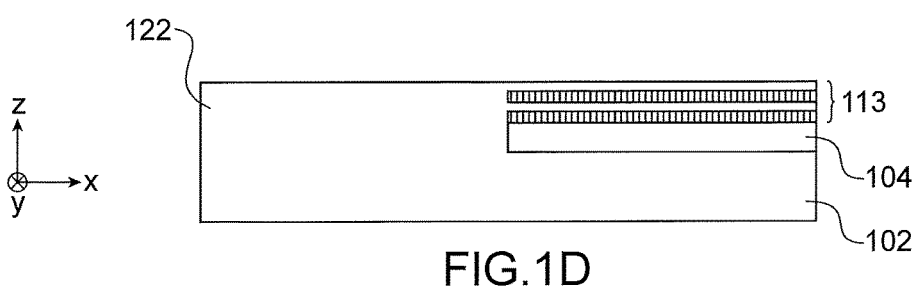
Figure 1E:
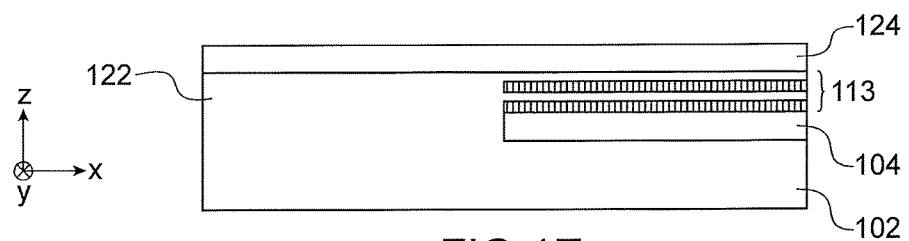
Figure 1F:
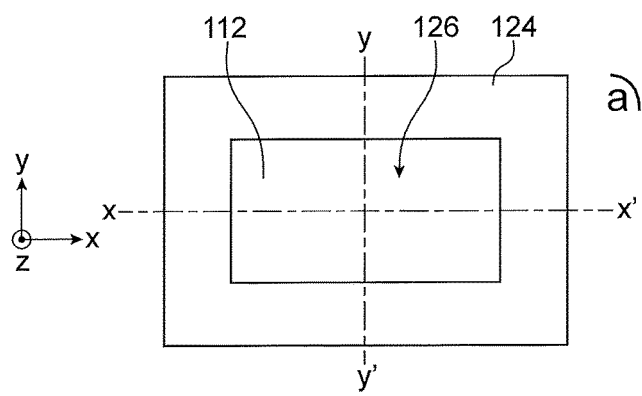
Figure 1F:
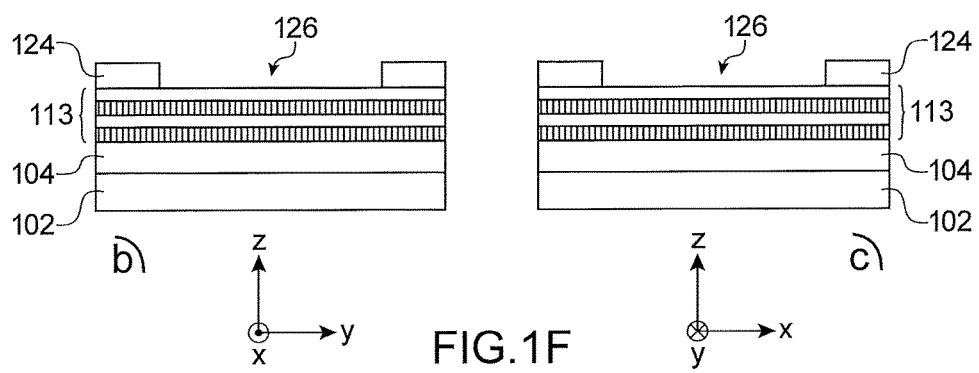
Figure 1G:
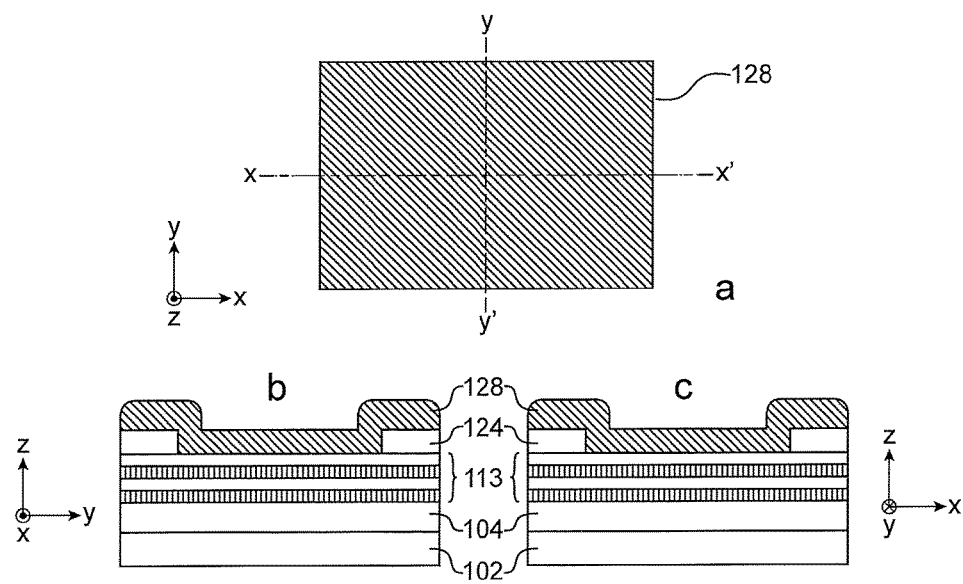
Figure 1H:
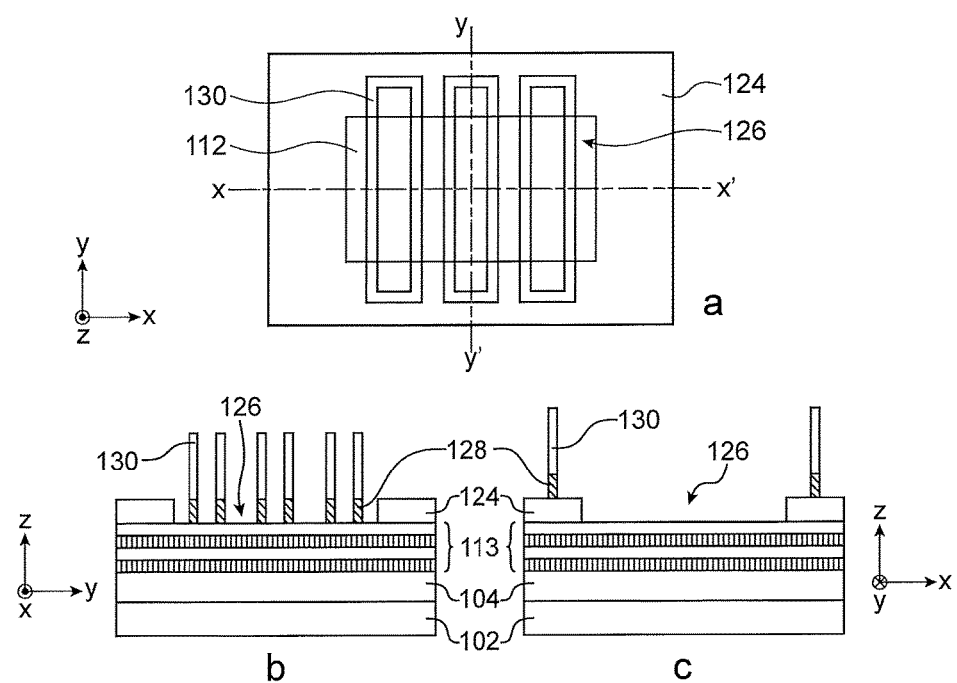
Figure 1I:
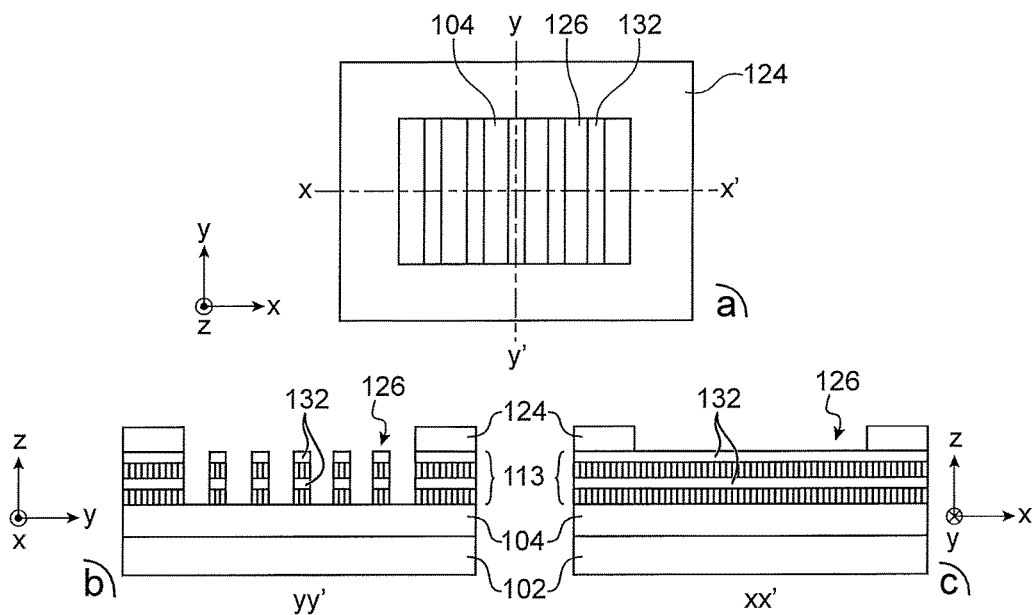
Figure 1J:
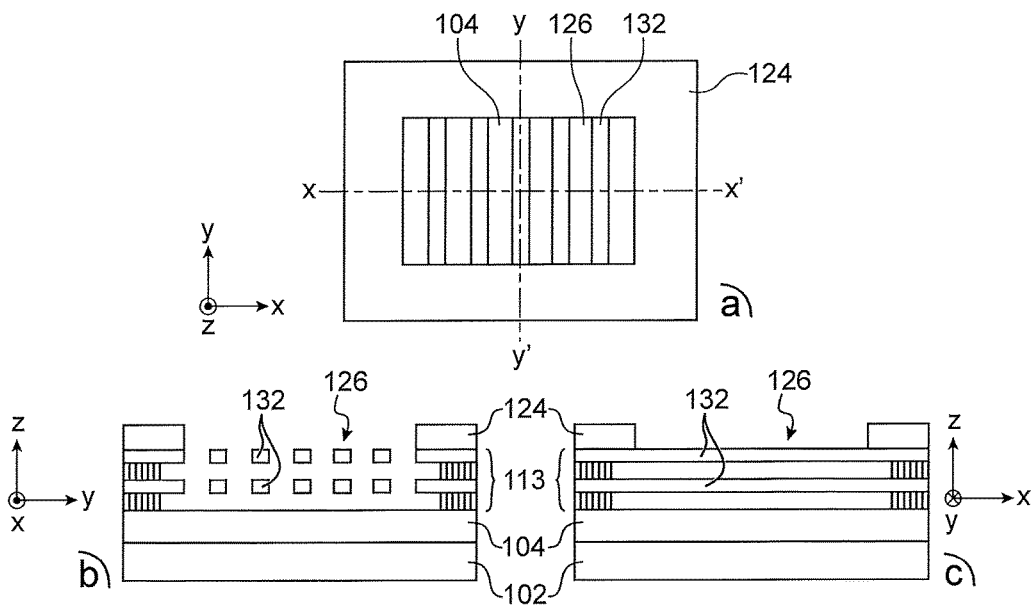
Figure 1K:
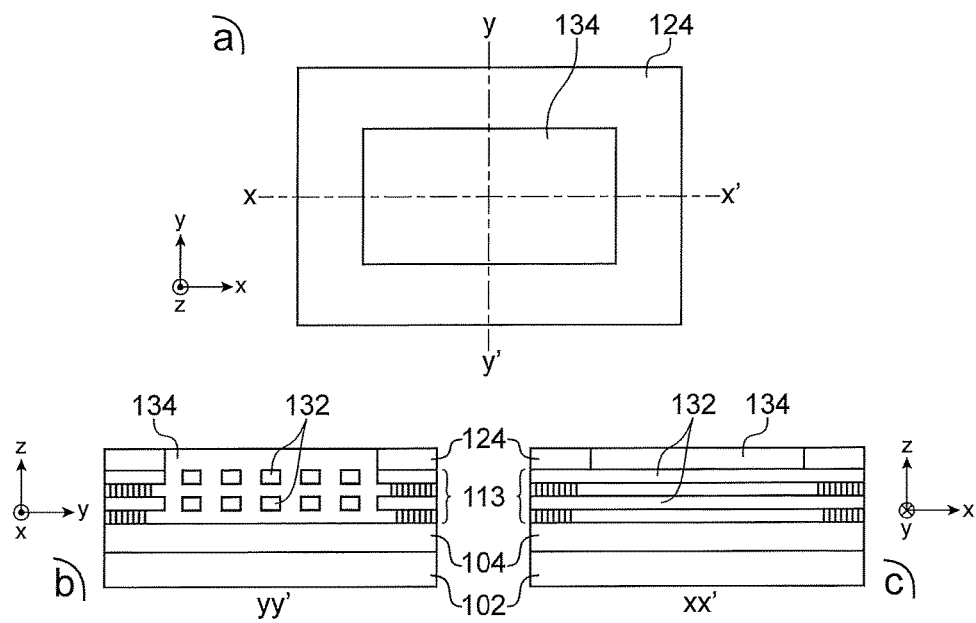
Figure 1L:
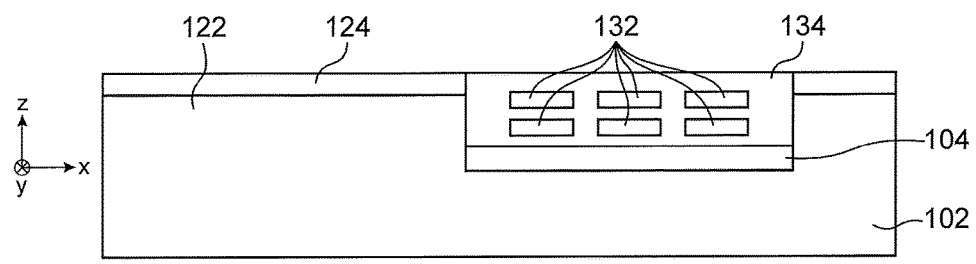
Figure 1M:
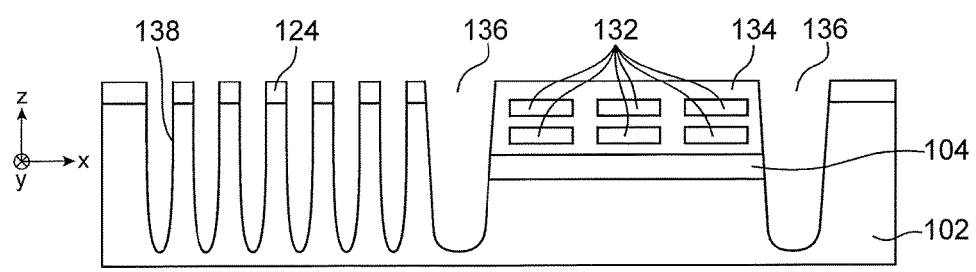
Figure 1N:
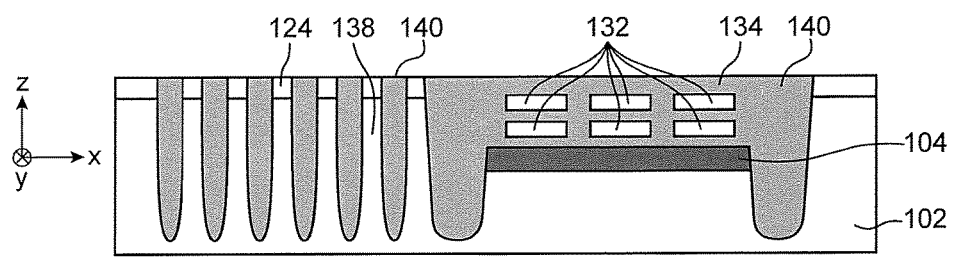
Figure 1O:
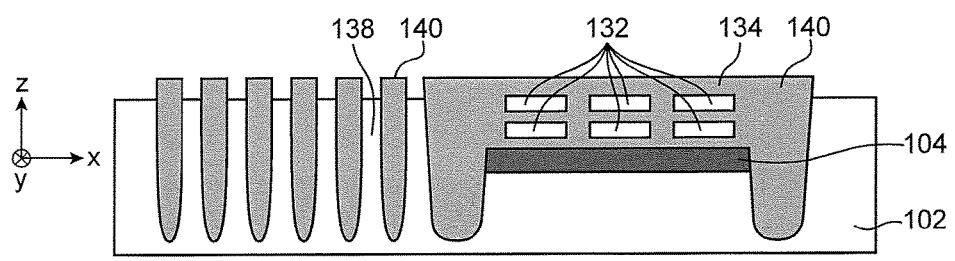
Figure 1P:
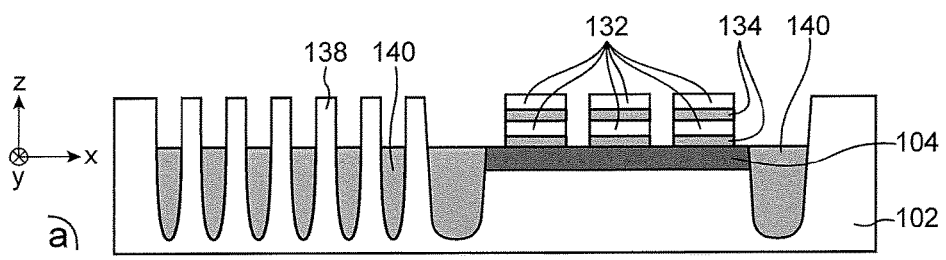
Figure 1P:
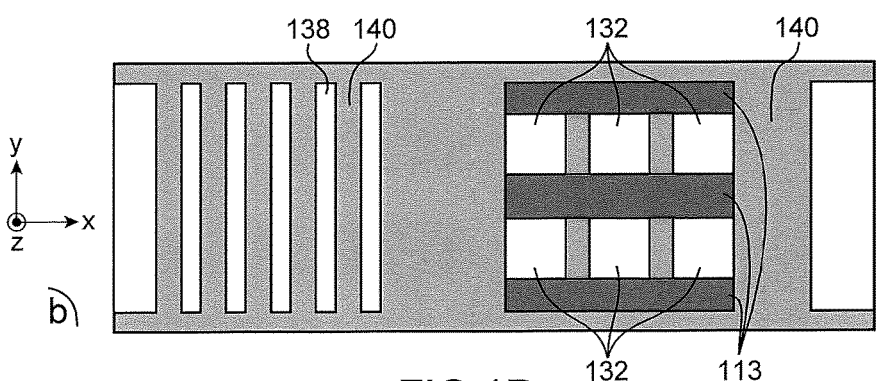
Figure 1Q:
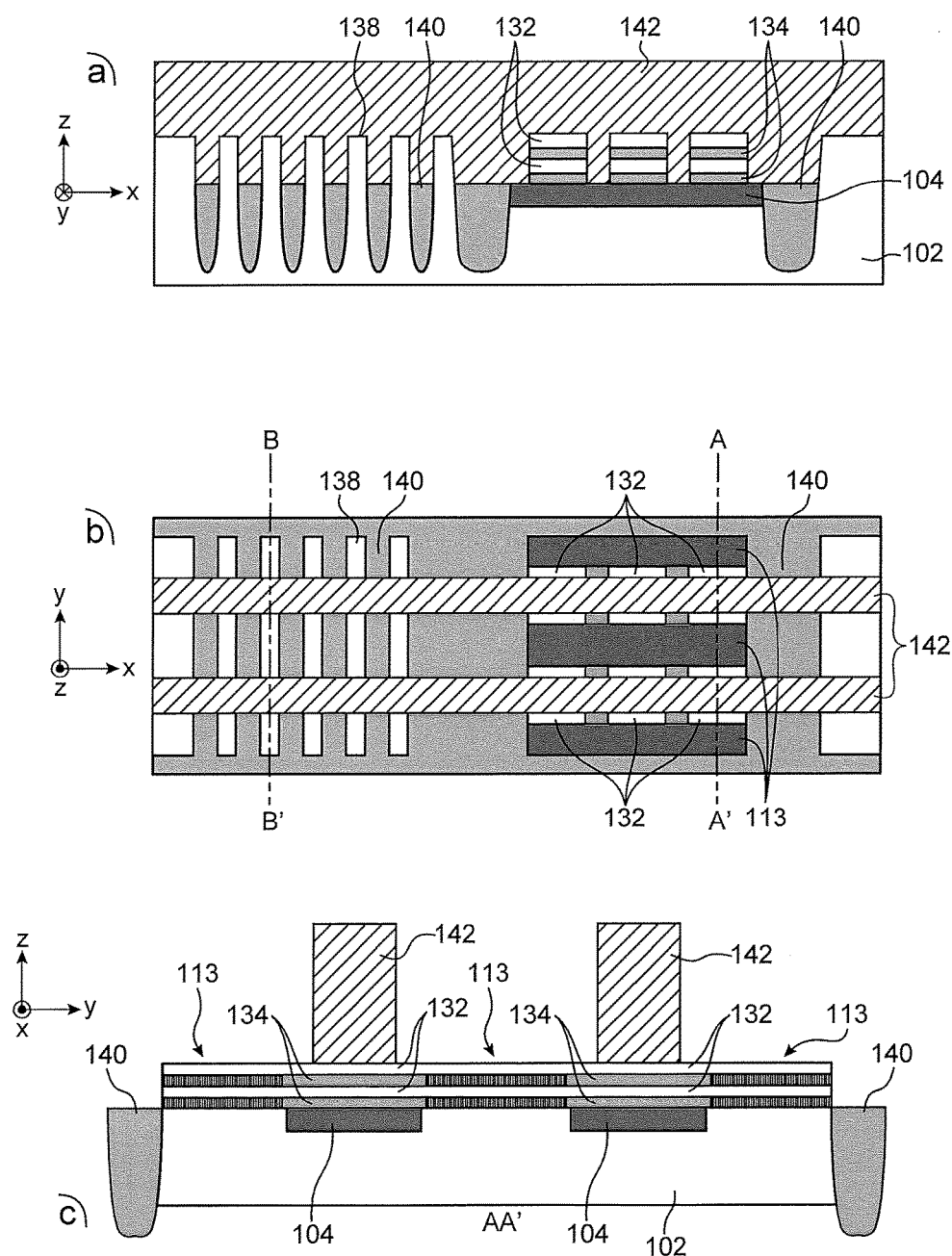
Figure 1Q:
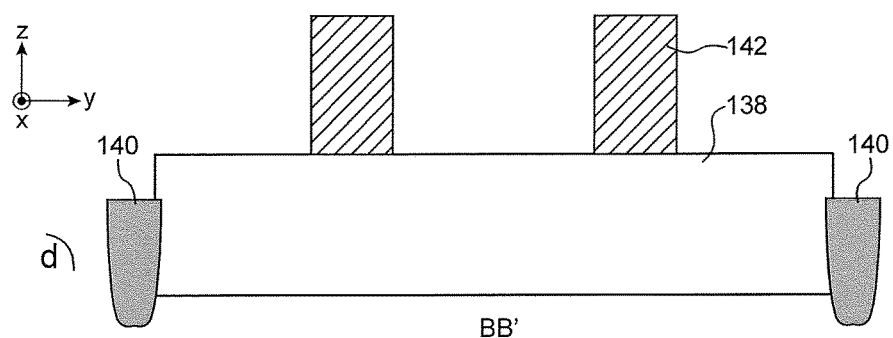
Figure 1R:
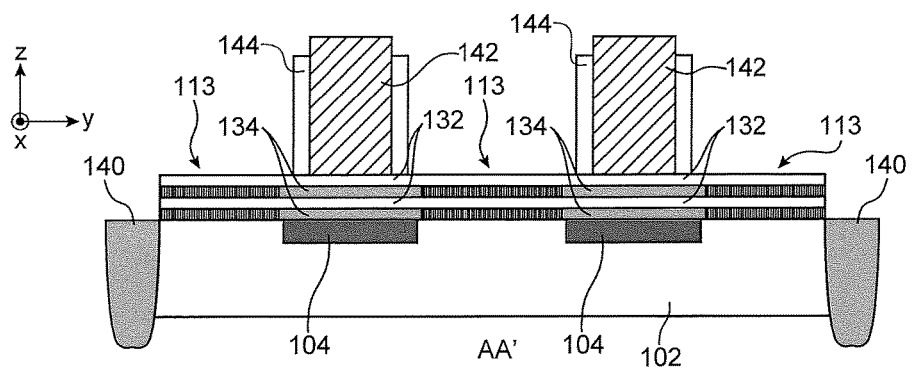
Figure 1S:
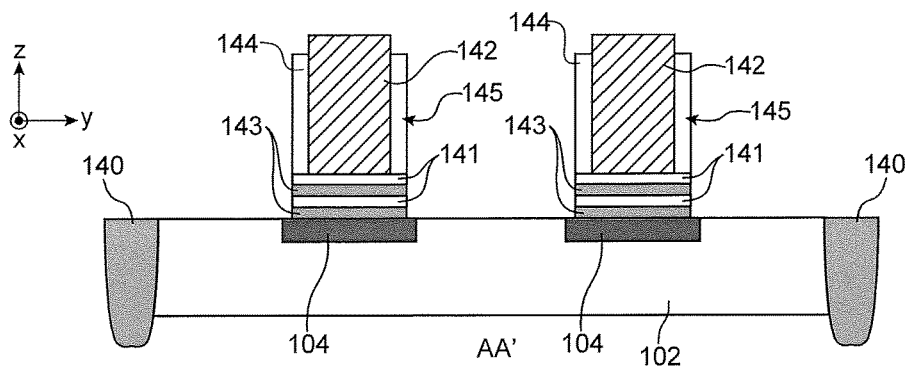
Figure 1T:
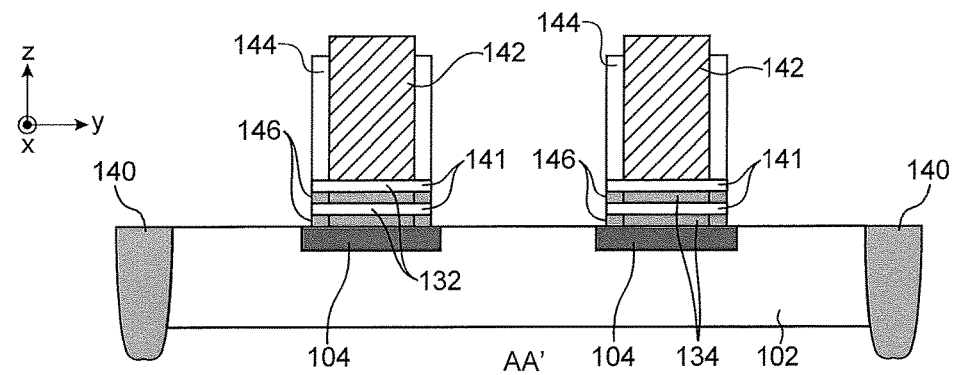
Figure 1U:
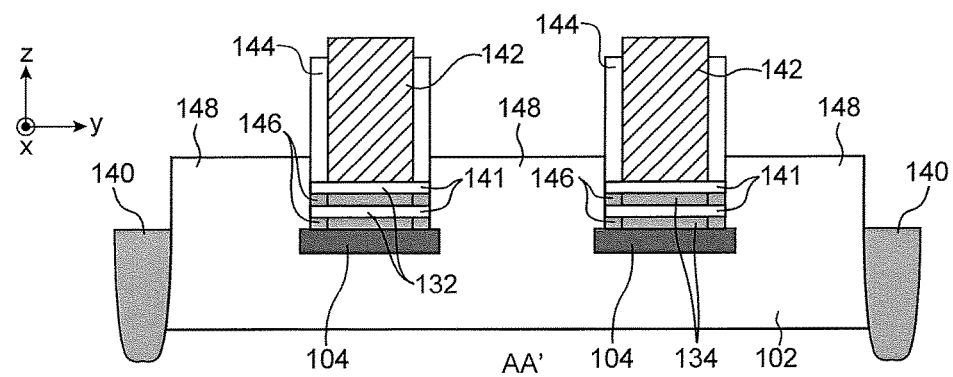
Figure 1V:
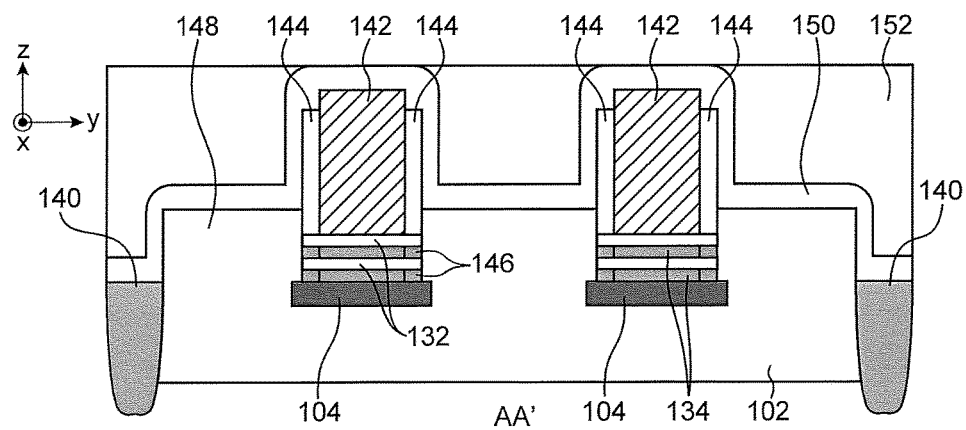
Figure 1W:
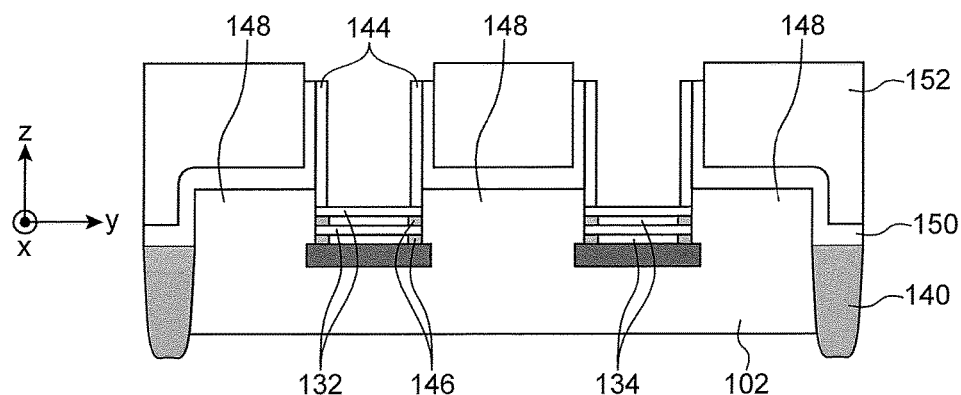
Figure 1X:
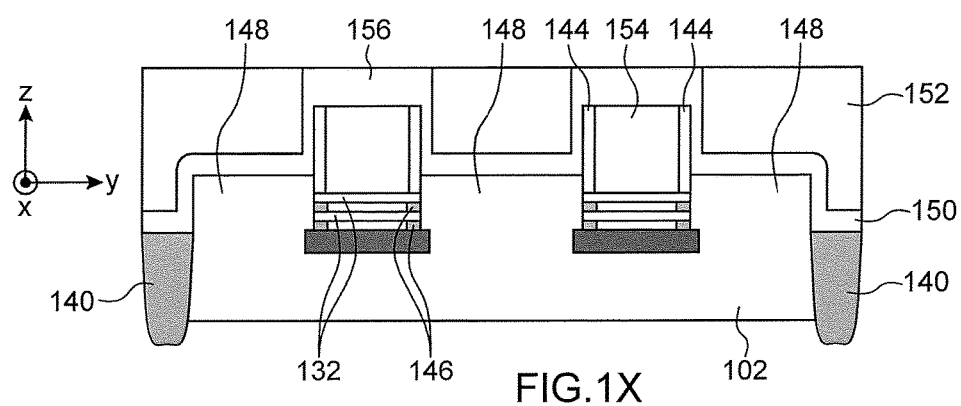
Figure 1Y:
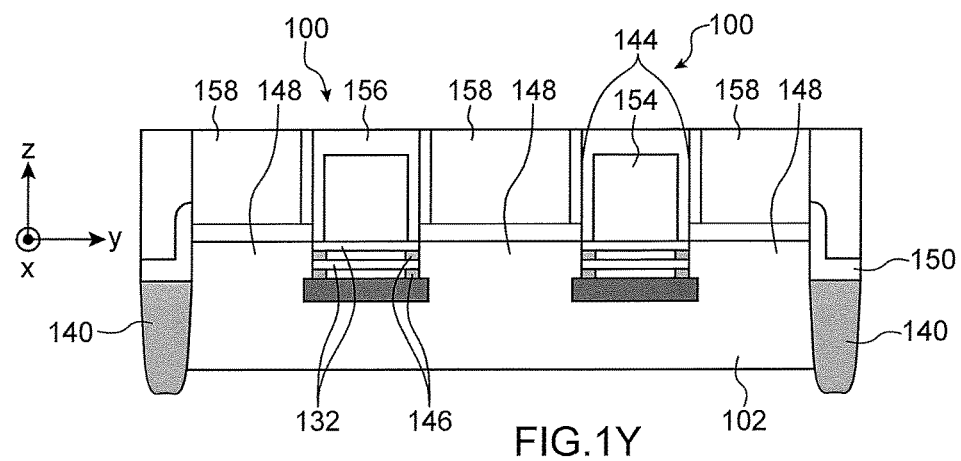
Figure 1Z:
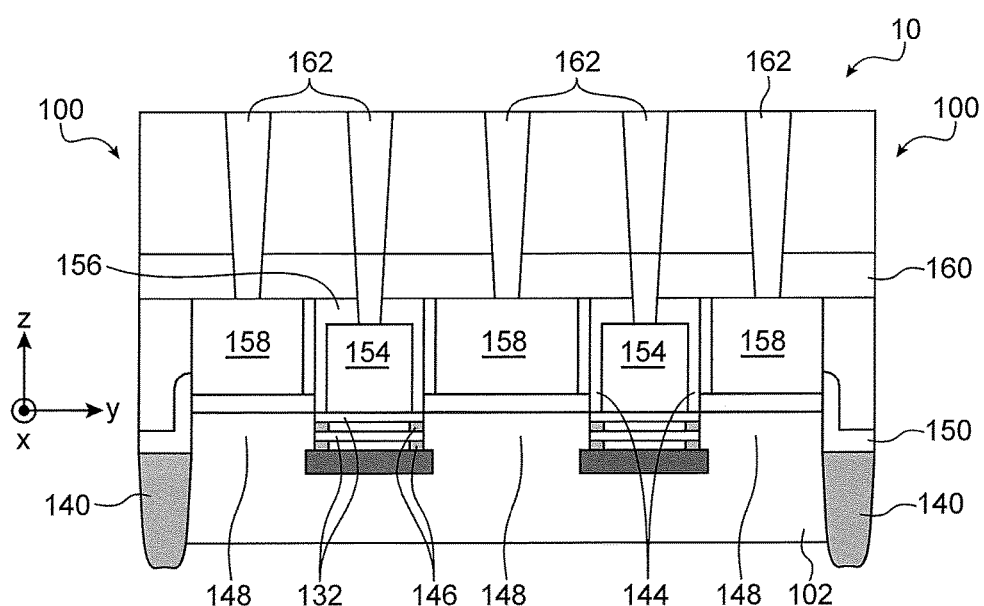

Reference is made to FIGS. 1A to 1Z, which show the steps of a method form making a semiconductor device 10 which comprises semiconductor nanowire transistors 100 according to a particular embodiment. In this embodiment the transistors 100 are of the GAAFET type. Moreover, this method according to this particular embodiment also makes FinFET type transistors co-integrated with the transistors 100 on a given substrate within the semiconductor device 10.

In FIG. 1A the thickness of the various layers mentioned below corresponds to the dimensions parallel to the Z axis shown in FIG. 1A.

As shown in FIG. 1A, this method is performed from a semiconductor-on-insulator type substrate, here SiGeOI (SiGe-On-Insulator) comprising a thick layer 102 of semiconductor, for example silicon, on which a buried dielectric or BOX (Buried oxide) layer 104 is arranged, comprising, for example, $SiO_2$. The thickness of the buried dielectric layer 104 is, for example, equal to or greater than about 20 nm, and is here equal to about 25 nm. The SiGeOI substrate also comprises a surface layer 106 of semiconductor, here comprising SiGe. The thickness of the surface layer 106 is, for example, equal to about 8 nm, or between about 5 nm and 10 nm.

Layers intended to be used for the making of one or more nanowires of each of the transistors 100 are then made on the substrate. In the embodiment described here, each transistor 100 is intended to comprise two superimposed, or stacked, silicon nanowires. For this the layers made on the substrate correspond to a layer of silicon 108 formed on the surface layer 106, a layer of SiGe 110 formed on the layer 108 and another layer of silicon 112 formed on the layer 110.

The layers 106, 108, 110 and 112 together form a stack 113 of layers arranged on a support formed by the thick layer 102 and the buried dielectric layer 104. These layers 106, 108, 110 and 112 comprise crystalline semiconductors formed by epitaxy.

The thickness of the second layer of SiGe 110 is, for example, equal to that of the surface layer 106, so that the distance between the nanowires of the transistors 100 (which are to be formed from layers 108 and 112) corresponds to that between the buried dielectric layer 104 and the first nanowire. Moreover the thickness of the layers 108 and 112 correspond to the desired thickness of the nanowires of transistors 100. The thickness of the layers 108 and 112 are, for example, equal to about 7 nm and may be between 2 nm and 50 nm.

The number of layers in the stack 113 is selected depending on the number of superimposed nanowires that each transistor 100 is intended to possess. For example, if each transistor 100 is intended to comprise three superimposed nanowires, then the stack of layers 113 may comprise an additional layer of SiGe arranged on the layer 112 and an additional layer of silicon arranged on the additional layer of SiGe.

In general, each transistor 100 may comprise 1, 2, 3, or 4 superimposed nanowires (advantageously 3 nanowires), or even more than 4 superimposed nanowires, for example between about 1 and 20 superimposed nanowires.

The materials in layers 108 and 112 are chosen depending on the materials intended to form the nanowires of transistors 100. Moreover, the materials in layers 106 and 110 are selected such that they can be selectively etched relative to those of layers 108, 112. The materials used in this method to form the nanowires, as well as those of the layers between the nanowires may be different from the Si/SiGe example described here.

In the embodiment described here, the layers 108, 110, 112 are made so as to form, with the surface layer 106, a Si/SiGe superlattice of type: $Si/Si_{1-x}Ge_x/Si/Si_{1-x}Ge_x$, where, for example, $0.05<X<1$.

Alternatively, it is possible for the nanowires to be made from a layer of SiGe and for the silicon layers to form sacrificial layers located between the SiGe nanowires.

The stack 113 made is then etched in order to preserve only the parts of these layers at the regions intended for the making of the transistors 100. For this a layer 114 comprising, for example, TEOS or silicon nitride such as SiN, is deposited on the stack 113 (FIG. 1B), then etched in order that the remaining parts of this layer 114 form a hard mask 116 which covers the parts of the stack of layers 106-112 intended for making the transistors 100. Lithography and etching steps are then performed to remove the parts of the layers of the stack 113 as well as of the buried dielectric layer 104 arranged at the locations of the FinFET transistors. In FIG. 1C, reference 118 designates the region or regions where the parts of the layers 104-112 have been removed to make the FinFET transistors. The remaining part or parts of the buried dielectric layer 104 and of the stack 113 are intended for use in making of the transistors 100.

Epitaxy is then performed so as to form, in the region 118, a portion 122 of semiconductor of the same nature as that of the layer 102 (here silicon) and of thickness equal to the sum of that of the buried dielectric layer 104 and of the remaining part of the stack 113. The hard mask 116 is then removed (FIG. 1D).

A layer 124, intended to form a hard mask for making the nanowires of the transistors 100 is then deposited on the stack 113 and on the portion 122 (FIG. 1E). The layer 124 comprises, for example, SiN and has, for example, a thickness of between a few nanometres (less than 10 nm) and a few tens of nanometres (less than 100 nm), for example equal to about 15 nm.

One or more openings 126 are then made through the part or parts of the layer 124 which cover the part or parts 120 of the stack (FIG. 1F, on which a single opening 126 is made). This opening 126 is located facing the part or parts of the stack 113 intended to be etched in order to form the nanowires of the transistors 100. The parts of the layer 124 present around the opening or openings 126 cover the parts of the stack to which the suspended nanowires are to be anchored.

In FIGS. 1F to 1K, only one part is shown of the device 10 where it is intended to make the nanowires of one of the transistors 100. View a) of each of the FIGS. 1F to 1K shows a top view of this part of the device 10, and the views b) and c) correspond to section views along axes yy' and xx' seen in view a) respectively. The part of the layer 124 covering the portion 122 (not shown in FIGS. 1F to 1K) is preserved and is not etched, so that the steps carried out described in association with FIGS. 1F to 1K have no impact on this part of the device 10 at which the FinFET transistors are made.

A second hard mask is then formed in the opening 126 to etch the layers of the stack 113 and form the nanowires of the transistors 100. In FIG. 1G, this second hard mask is made from a layer 128 comprising, for example, a metallic material such as TiN and of thickness, for example, equal to about 10 nm, which covers the layer 124 as well as the part of the stack 113 that is accessible through the opening 126.

At this stage of the method, various steps may be performed to etch the layers 106-112 and form the nanowires of the transistors 100.

In the first embodiment described here, these steps correspond to those of a SIT type method. Portions of material of long and slender form and whose length (their largest dimension) extends parallel to the length of the nanowires that are to be made, are formed on the part of the layer 128 located in the opening 126. The edges of these portions of material spill over onto the part of the layer 128 covering the layer 124. Spacers 130 are then made (deposition and anisotropic etching) around these portions of material, and then these portions of material are removed in order to retain only the spacers 130. These spacers 130 are then used as a mask for etching the layer 128 which then serves to form the mask used in the etching of the stack 113. The structure obtained at this stage in the method is shown in FIG. 1H.

The spacers 130 are then removed, then the parts of the stack 113 not covered by the remaining parts of the layers 124 and 128 are etched. The hard mask formed by the remaining parts of the layer 128 is then removed (FIG. 1I).

Selective etching of the SiGe of the layers 106 and 110 relative to the silicon of the layers 108 and 112 is then performed, thus releasing the parts of the layers 108 and 112 located facing the opening 126 and which form the suspended nanowires 132 which are to form the channels of the transistors 100 (FIG. 1J). The nanowires 132 are anchored in the parts of the stack 113 covered by the parts of the layer 124.

The SIT-type steps described above for forming the nanowires 132 have the advantage of allowing nanowires 132 to be made with a high resolution, or a high density. Indeed the spacers 130 formed around each of the initial portions of material allow an etch mask to be made whose resolution is doubled compared with the resolution with which these initial portions of materials are made. Thus by making these initial portions of material with a resolution of about 80 nm (width, along the Y axis, of each of these portions equal to about 40 nm, and a spacing along the Y axis between two consecutive neighbouring portions equal to about 40 nm), it is possible to make nanowires 132 which have a resolution of about 40 nm, that is a width (dimension along the Y axis) equal to about 20 nm and a spacing (along the Y axis) between two consecutive neighbouring nanowires 132 equal to about 20 nm.

Alternatively, the steps performed in order to make the nanowires 132 previously described in association with the FIGS. 1H and 1I can be replaced by steps of a DSA-type method wherein blocks of copolymers are used as an etching mask, or steps of an etching method using EUV (Extreme Ultraviolet Lithography).

The nanowires 132 are then encapsulated by depositing a sacrificial material 134, for example semiconductor oxide, in the free spaces formed around the nanowires 132 during the previous etching steps performed (FIG. 1K). This sacrificial material 134 is chosen such that its etch selectivity, that is, the ratio between the speed of etching of the sacrificial material 134 and that of the semiconductor of the nanowires 132, is greater than that of the semiconductor of the layers 106 and 100, and advantageously greater than or equal to about 100. For example the sacrificial material 134 may correspond to oxide such as $SiO_2$. Planarization, for example CMP, of the sacrificial material 134, with a stop on the layer 124, is then carried out.

In FIGS. 1L to 1P the entire device 10, that is the parts wherein the GAAFET and FinFET transistors are made, is shown.

Lithography and etching steps are then performed to etch isolation trenches 136 of the STI type around the region of the structure comprising the nanowires 132. These trenches are formed around the regions wherein the transistors 100 are made. These steps are also performed so as to form portions 138 of semiconductor intended to form fins of FinFET transistors (FIG. 1M), in the portion 122 and the bulk layer 102.

The trenches 136 as well as the spaces formed between the portions 138 are then filled with a dielectric material 140, which is similar for example to the sacrificial material 134. Planarization, for example CMP, with a stop on the layer 124, is then performed in order to remove the dielectric material 140 deposited outside the trenches 136 and the spaces between the portions 138 (FIG. 1N).

The layer 124 is then removed (FIG. 1O).

Anisotropic etching, dry or wet, is then carried out to remove a part of the thickness of the dielectric material 140. This etching is stopped when the level of the dielectric material 140 reaches that of the buried dielectric layer 104 (FIG. 1P). The view b) in FIG. 1P, which corresponds to a top view of the structure made, shows the regions where the nanowires 132 have been made, as well as the parts of the stack 113 which have been retained around the nanowires 132 and at which it is intended to make the source and drain regions of the transistors 100.

Sacrificial gates 142, or dummy gates, are then made in particular on the stacks of nanowires 132 intended to form the channels of transistors 100 as well as on the portions of semiconductor 138 intended to form channels of the FinFET transistors (FIG. 1Q, in which views a) and b) are respectively a section view and a top view of the entire structure made, and views c) and d) are, respectively, section views along axes AA' and BB' shown in view b)). These sacrificial gates 142 are, for example, formed from a stack of $SiO_2$ and of polysilicon.

The sacrificial gates 142 are made for example by performing a conformal deposition (forming a layer of substantially constant thickness) of $SiO_2$ whose thickness is for example between about 2 nm and 6 nm, followed by deposition of polysilicon forming a layer whose thickness is between about 50 nm and 200 nm. CMP is then performed, then a mask made for example of silicon nitride and $SiO_2$, of thickness, for example, equal to about 40 nm and whose pattern corresponds to that of the sacrificial gates 142, is then deposited on the layer of polysilicon, then the layers of polysilicon and of $SiO_2$ are subsequently etched in accordance with the pattern defined by the mask.

An external spacer 144 comprising for example semiconductor nitride such as silicon nitride, or more generally a dielectric with low dielectric permittivity (equal to or less than 7, or "Low-k"), is then deposited and then etched anisotropically around each of the sacrificial gates 142, (FIG. 1R).

The parts of the stack 113 located at the future source and drain regions of the transistors 100 are then etched, revealing ends 141 of the nanowires 132 and ends 143 of the portions of sacrificial material 134 which are aligned with the external lateral faces 145 of the external spacer 144 (FIG. 1S).

Parts of the sacrificial material 134 located around the nanowires 132 are then etched from the ends 143 revealed by the previous etching of the parts of the stack 113, consuming a thickness of sacrificial material 134 (dimension parallel to the Y axis) similar to the thickness of the external spacer 144. Due to the fact that the etch selectivity of the sacrificial material 134 relative to the semiconductor of the nanowires 132 is very high, precise control over the etched thickness of the sacrificial parts of the sacrificial material 134 is possible. Moreover highly uniform etching is also obtained for all of the parts of the sacrificial material 134 as a result of the high etching selectivity. At the end of this etching the lateral flanks of the remaining parts of the sacrificial material 134 located around the nanowires 132 are aligned with those of the sacrificial gates 142. The cavities formed by this etching at the locations of the etched portions of the sacrificial material 134 are then filled via deposition of a dielectric material such as semiconductor nitride, for example SiN, or a Low-k dielectric, forming internal spacers 146, vertically aligned both at the external faces (those located next to the source and drain regions) and at the internal faces (those located at the side of the gate) with the external spacer 144 (FIG. 1T). These steps forming the internal spacers 146 are not performed for FinFET transistors.

An epitaxy is then performed from the semiconductor regions which are no longer covered by the parts of the stack 113, forming source and drain regions 148 of the transistors 100 (FIG. 1U). This epitaxy also forms the source and drain regions of the FinFET transistors. The semiconductor formed by this epitaxy corresponds for example to silicon in the case of NMOS type transistors 100, or SiGe in the case of PMOS type transistors 100. This epitaxy may be performed such that the semiconductor formed generates stress in the channel of the GAAFET and/or FinFET transistors.

A dielectric layer 150 comprising, for example, semiconductor nitride such as SiN and which has a thickness equal, for example, to about 40 nm, is then deposited onto the entire structure. Another dielectric layer 152 comprising, for example, an oxide such as $SiO_2$, then deposited then planarized, with stopping on the layer 150 (more precisely on the parts of the layer 150 located at the top of the sacrificial gates) (FIG. 1V).

The parts of the layer 150 arranged on the tops of the sacrificial gates are then etched, for example by performing chemical etching of the $H_3PO_4$ type. Sacrificial gates 142 are then selectively etched relative to the external 144 and internal 146 spacers by performing, for example, chemical etching of the TMAH type (FIG. 1W).

The portions of sacrificial material 134 located around the nanowires 132 are then removed by etching. A gate dielectric (material with high dielectric permittivity, for example greater than about 3.9 or High-K, for example $HfO_2$, $ZrO_2$, $TiO_2$, $Al_2O_3$, etc.) then at least one conductive gate material, for example metallic, and which advantageously corresponds to a TiN/W bilayer, are then deposited in the gate locations formed by carrying out the preceding etching steps of sacrificial gates 142 and of portions of sacrificial material 134, thus forming the gates 154 of the GAAFET and FinFET transistors. The dielectric and conductive materials of the gates 154 surround each of the nanowires 132. Dielectric portions 156 which comprise for example the same material as that of the layer 150 are then formed on the gates 154 (FIG. 1X).

The parts of the layers 150, 152 arranged on the source and drain regions 148 are removed in order to subsequently form electrical contacts 158 on these regions 148 (FIG. 1Y).

The GAAFET 100 and FinFET transistors are completed by depositing dielectric layers 160 on the entire structure and then forming, through these dielectric layers 160, connection studs 162 electrically connected to the gates 154 and to the electrical contacts 158 of the transistors (FIG. 1Z).

In the specific embodiment described above, the substrate used to make the GAAFET 100 and FinFET transistors is a SiGeOI substrate. Alternatively, the substrate used could be an SOI (Silicon on Insulator) substrate. The choice of the nature of the substrate depends in particular on the material intended to be used for the nanowires of the transistors 100.

Figure 2A:
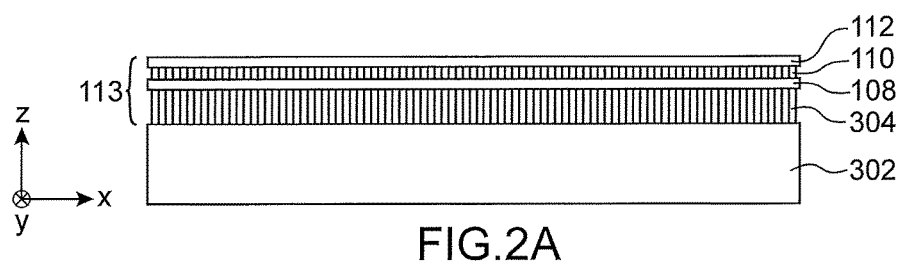
FIGS. 2A, 2B and 3A show the steps of a method for making semiconductor nanowire transistors according to various alternative embodiments.

According to another alternative, the substrate used to make transistors 100 and 200 may be of the bulk type, that is, comprising only a bulk semiconductor layer, for example silicon. FIG. 2A represents such a substrate 302 comprising, for example, silicon. In this case the stack 113 of layers made on such a substrate 302 at the start of the method may be such that it comprises a first layer of material 304, intended to be etched during the formation of the nanowires 132. For example, in the case of nanowires 132 of silicon, the first layer 304 may comprise SiGe. The thickness of this first layer 304 may also be greater than that of the other layers in the stack, for example of the order of 33 nm.

Figure 2B:
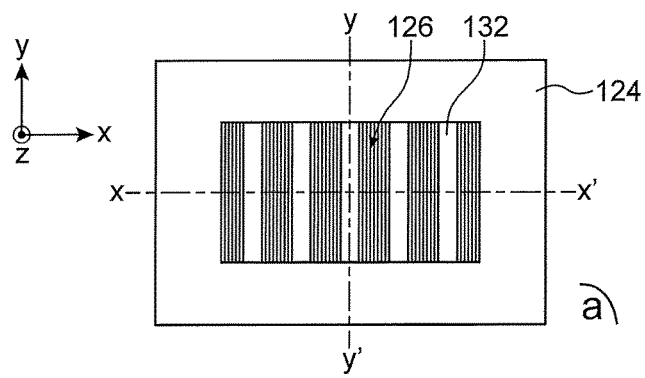
Figure 2B:
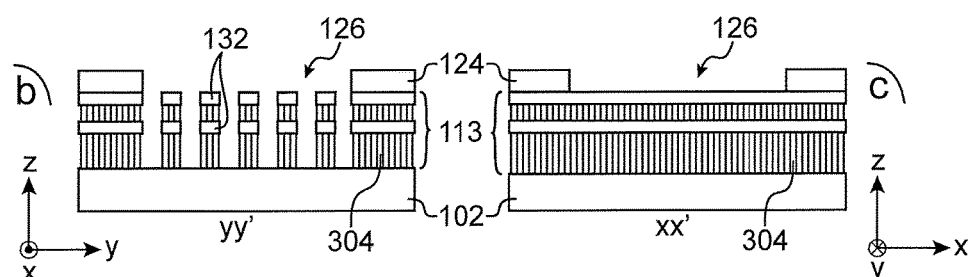

The steps performed to make the transistors 100 and 200 from such a substrate 302 may be similar to those previously described in association with FIGS. 1B to 1Z. By way of an illustration, FIG. 2B represents the structure obtained when the steps previously described in association with FIGS. 1A to 1I have been performed. Then, during the release of the nanowires 132, the entire thickness of the parts of the layer 304 is removed.

Figure 3A:
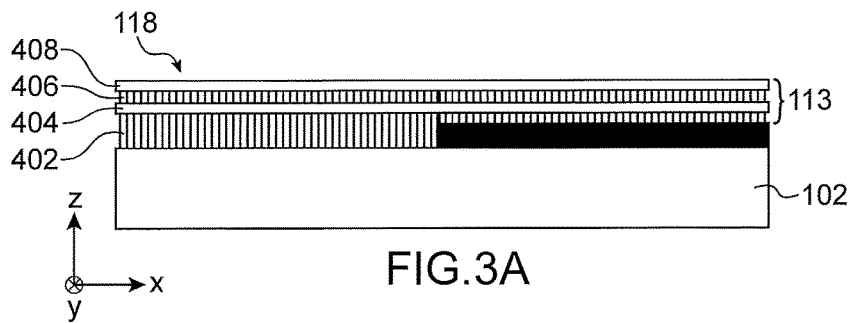

According to another alternative, it is possible to use an SOI substrate and form a region 118 comprising a stack of layers allowing semiconductor nanowires to be formed. FIG. 3A shows the structure obtained after performing the steps previously described in association with FIGS. 1A-1C and wherein, instead of then carrying out epitaxy of the portion 122, alternating epitaxy steps of SiGe and of silicon are performed to make a stack of alternating layers of SiGe (references 402 and 406 in FIG. 3A, where the thickness of the layer 402 is equal to the sum of thickness of layers 104 and 106) and of silicon (references 404 and 408 in FIG. 3A). Such a structure is advantageous when the superimposed nanowires are integrated both on bulk substrate and on SOI substrate.

In the specific embodiment described previously, the method is performed in order to make, in a co-integrated manner, GAAFET type transistors 100 and FinFET type transistors. Alternatively, this method can be performed in order to form only GAAFET transistors 100. In this case the steps described previously in association with the FIGS. 1B to 1D may be omitted.

The invention claimed is:
1. A method for making at least one semiconductor device, comprising at least:
 a) making, on a support, of a stack of layers comprising at least one first crystalline semiconductor layer and at least one second crystalline semiconductor layer capable of being selectively etched in relation to the semiconductor of the first layer, wherein the second layer is arranged between the first layer and the support;

b) etching of part of the stack of layers such that at least one portion of the first layer forms a nanowire arranged on a portion of the second layer;

c) selective etching of said portion of the second layer;

d) making, in at least one space formed beneath the nanowire by etching of said portion of the second layer, of at least one portion of sacrificial material, where the etching selectivity of the sacrificial material relative to the semiconductor of the first layer is greater than that of the semiconductor of the second layer relative to the semiconductor of the first layer;

e) making of at least one sacrificial gate and of at least one external spacer laterally surrounding the sacrificial gate;

f) etching of the stack of layers, revealing ends of the nanowire and of the portion of sacrificial material aligned with the external lateral faces of the external spacer;

g) selective etching of parts of the portion of sacrificial material, from the ends of the portion of sacrificial material, forming aligned cavities beneath the external spacer;

h) making of at least one internal spacer in the cavities, aligned with the external spacer.

2. The method according to claim 1, wherein the sacrificial material is of the semiconductor oxide type.

3. The method according to claim 1, wherein:
the semiconductor of the first layer is silicon or SiGe and the semiconductor of the second layer is SiGe comprising a proportion of Germanium which is greater than that of the semiconductor of the first layer, or
the semiconductor of the second layer is silicon or SiGe and the semiconductor of the first layer is SiGe comprising a proportion of Germanium which is greater than that of the semiconductor of the second layer.

4. The method according to claim 1, wherein the semiconductor device comprises at least one GAAFET type transistor whose channel is formed at least in part by the nanowire.

5. The method according to claim 4, comprising moreover, between steps d) and e), a step for making isolation trenches around the nanowire and the portion of sacrificial material.

6. The method according to claim 5, comprising moreover, between steps a) and b), the making, on the support, of at least one portion of semiconductor of thickness substantially equal to that of the stack of layers, and wherein the making of isolation trenches comprises performing etching which also forms fins capable of forming the channel of a FinFET type transistor in said portion of semiconductor.

7. The method according to claim 1, wherein the stack of layers comprises several first layers stacked in an alternating manner with several second layers and wherein the steps b) to h) are performed for all the first and second layers.

8. The method according to claim 1, wherein the etching step b) makes several portions of the first layer forming several nanowires arranged next to each other, and wherein steps c) to h) are performed for all of said nanowires.

9. The method according to claim 1, wherein:
the support corresponds to a bulk substrate of semiconductor whereupon the stack of layers is made, or
the support comprises a thick layer and a buried dielectric layer of a semiconductor on insulator type substrate, where a surface semiconductor layer of the substrate forms the second layer of the stack made on the support.

10. The method according to claim 1, wherein step d) comprises performing deposition of sacrificial material around the nanowire.

11. The method according to claim 1, wherein the etching step b) is performed from a hard mask made on the stack by a SIT or DAS method, or by EUV lithography.

12. The method according to claim 1, moreover comprising, after step h), performing the following steps:
making of source and drain regions in contact with the ends of the nanowire;
removal of the sacrificial gate and of the portion of sacrificial material;
making of a gate at locations formed by the removal of the sacrificial gate and of the portion of sacrificial material, such that the gate at least partially surrounds the nanowire and such that the internal and external spacers laterally surround the gate.

13. The method according to claim 12, wherein the source and drain regions are made by performing semiconductor epitaxy from a semiconductor of the support.

14. The method according to claim 1, wherein the sacrificial gate and the gate each comprise several distinct portions separated from each other.

* * * * *